(12) United States Patent
Noel et al.

(10) Patent No.: US 8,969,967 B2
(45) Date of Patent: Mar. 3, 2015

(54) SELF-CONTAINED INTEGRATED CIRCUIT INCLUDING ADJACENT CELLS OF DIFFERENT TYPES

(75) Inventors: Jean-Philippe Noel, Montbonnot-Saint Martin (FR); Bastien Giraud, Grenoble (FR); Olivier Thomas, Revel (FR)

(73) Assignee: Commissariat a l'energie et aux energies alternatives, Paris (FR)

( * ) Notice: Subject to any disclaimer, the term of this patent is extended or adjusted under 35 U.S.C. 154(b) by 0 days.

(21) Appl. No.: 14/118,955

(22) PCT Filed: May 22, 2012

(86) PCT No.: PCT/EP2012/059519
§ 371 (c)(1),
(2), (4) Date: Nov. 20, 2013

(87) PCT Pub. No.: WO2012/160071
PCT Pub. Date: Nov. 29, 2012

(65) Prior Publication Data
US 2014/0077300 A1    Mar. 20, 2014

(30) Foreign Application Priority Data

May 24, 2011   (FR) ...................................... 11 54520
Sep. 26, 2011  (FR) ...................................... 11 58545

(51) Int. Cl.
| | |
|---|---|
| *H01L 27/12* | (2006.01) |
| *H01L 27/092* | (2006.01) |
| *H01L 27/11* | (2006.01) |
| *H01L 21/8238* | (2006.01) |

(Continued)

(52) U.S. Cl.
CPC .......... *H01L 27/092* (2013.01); *H01L 27/1108* (2013.01); *H01L 27/1203* (2013.01); *H01L 21/823878* (2013.01); *H01L 21/823892* (2013.01); *H01L 21/84* (2013.01); *H01L 27/11* (2013.01); *H01L 29/78645* (2013.01)
USPC .................... 257/351; 257/371; 257/E27.067

(58) Field of Classification Search
USPC .................................. 257/351, 371, E27.067
See application file for complete search history.

(56) References Cited

U.S. PATENT DOCUMENTS

| | | |
|---|---|---|
| 6,063,686 A | 5/2000 | Masuda et al. |
| 6,072,217 A | 6/2000 | Burr |

(Continued)

OTHER PUBLICATIONS

O. Thomas et al. "32nm and beyond Multi-$V_T$ Ultra-Thin Body and Box FDSOI: From device to circuit", Proceedings of 2010 IEEE International Symposium on Circuits and Systems, May 1, 2010, pp. 1703-1706, XP055011534.

(Continued)

*Primary Examiner* — Tan N Tran
(74) *Attorney, Agent, or Firm* — Occhiuti & Rohlicek LLP

(57) ABSTRACT

An integrated circuit includes a stack having a semiconductor substrate with a first type of dopant, an UTBOX type buried insulating layer, electronic components, formed in the substrate, ground planes disposed beneath the buried insulating layer so as to be respectively plumb with corresponding components, wells with the first type of dopant, the wells being respectively beneath corresponding ground planes, and a bias circuit enabling distinct voltages to be applied to the ground planes by the wells. The wells are separated from the substrate by a deep well with a second type of dopant. The wells are separated from each other by a separating structure, which is either a lateral well having a second type of dopant or a block of insulating material.

20 Claims, 8 Drawing Sheets

(51) Int. Cl.
*H01L 21/84* (2006.01)
*H01L 29/786* (2006.01)

(56) References Cited

U.S. PATENT DOCUMENTS

| 7,112,997 | B1 | 9/2006 | Liang et al. |
| 2006/0027877 | A1 | 2/2006 | Inaba |
| 2007/0063284 | A1 | 3/2007 | Kawahara et al. |

OTHER PUBLICATIONS

J-P Noel et al: "UT2B-FDSOI device architecture dedicated to low power design techniques", Solid-State Device Research Conference (ESSDERC), 2010 Proceedings of the European, IEEE, Piscataway, NJ, USA, (Sep. 14, 2010), pp. 210-213, XP031787588.

Jeane-Philippe Noel et al: "Multi-$V_T$ UTBB FDSOI Device Architectures for Low-Power CMOS Circuit", IEEE Transactions on Electron Devices, IEEE Service Center, PI Sacataway, NJ, US, vol. 58, No. 8, (Aug. 1, 2011), pp. 2473-2482, XP011336322.

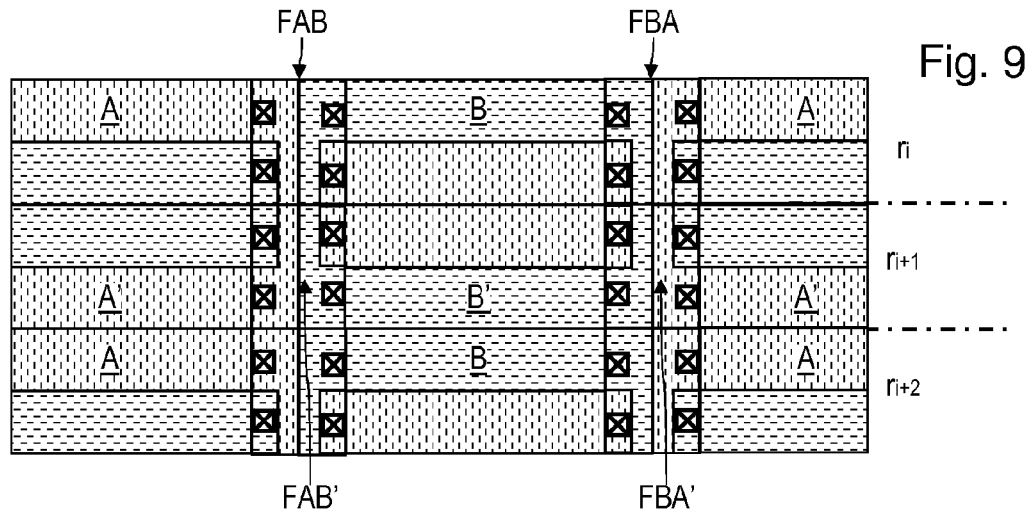
Fig. 9
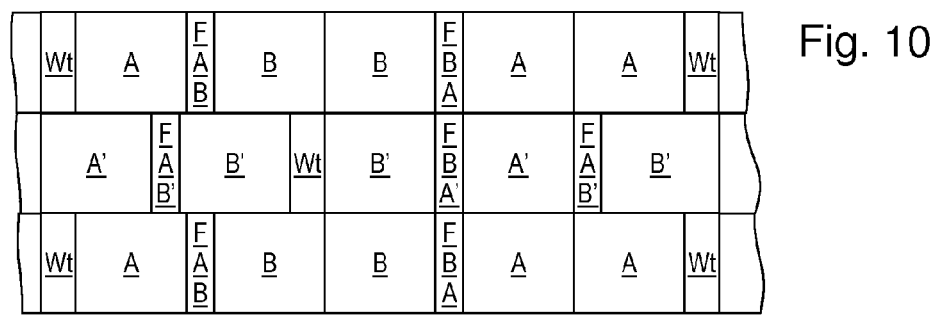
Fig. 10
Fig. 11
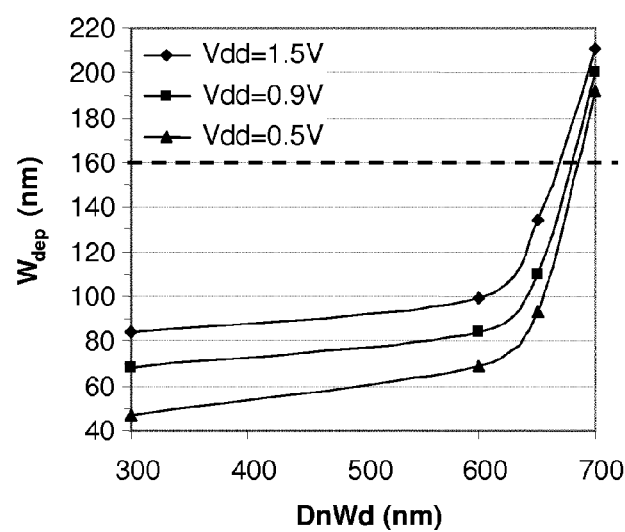

SELF-CONTAINED INTEGRATED CIRCUIT INCLUDING ADJACENT CELLS OF DIFFERENT TYPES

CROSS REFERENCE TO RELATED APPLICATION

This application is the national phase under 35 USC 371 of international application no. PCT/EP2012/059519, filed May 22, 2012, which claims the benefit of the priority date of French application no. 1154520, filed May 24, 2011 and the priority date of France application no. 1158545, filed Sep. 26, 2011. The contents of the aforementioned applications are incorporated herein in their entirety.

FIELD OF DISCLOSURE

The invention pertains to integrated circuits and especially to integrated circuits on a silicon-on-insulator (SOI) type substrate.

BACKGROUND

SOI technology consists in separating a fine layer of silicon (a few nanometers thick) from a silicon substrate by a relatively thick layer of insulator (with a thickness of a few tens of nanometers as a general rule).

Integrated circuits made with SOI technology have a certain number of advantages. Such circuits generally consume less electricity for equivalent performance. Such circuits also induce lower parasitic capacitances, thus improving switching speed. Furthermore, the latch-up or parasitic triggering phenomenon encountered by MOS transistors in bulk technology can be avoided. Such circuits therefore are particularly well suited to SoC or MEMS type applications. It is generally noted that SOI integrated circuits are less sensitive to the effects of ionizing radiation and are hence more reliable in applications where such radiation could cause operational problems, especially in space applications. SOI integrated circuits can include, especially, SRAM random-access memories or logic gates.

Reducing the static consumption of logic gates while at the same time increasing their switchover speed is the subject of much research. Certain integrated circuits that are being developed integrate both low-consumption logic gates and high-switchover-speed logic gates. To generate both these types of logic gates on a same integrated circuit, the threshold voltage level of some transistors of high-access-speed logic gates is reduced and the threshold voltage of other transistors of low consumption logic gates is increased. In bulk technology, the threshold level modulation of the same type of transistors is done by differentiating their channel doping level. However, in FDSOI (Fully Depleted Silicon-On-Insulator) technology, the doping of the channel is almost zero ($10^{15}$ cm$^{-3}$). Thus, the channel doping levels in the transistors cannot show big variations. This means that the threshold voltages cannot be differentiated by their channel doping levels. One solution proposed in certain studies for making transistors of the same type with distinct threshold voltages is to integrate different gate materials for these transistors. However, making such an integrated circuit is impractical because it is technically difficult and economically prohibitive.

In order to have distinct threshold voltages for different transistors using FDSOI technology, there are also known ways of using a biased ground plane placed between a thin layer of insulating oxide and the silicon substrate. By manipulating the doping of the ground planes and their biasing, it is possible to define a range of threshold voltages for the different transistors. One could thus have low-voltage-threshold, or LVT transistors, high-voltage-threshold, or HVT transistors, and medium, or standard-voltage-threshold, also known as SVT transistors.

For certain functions of the circuit, it is possible to combine transistors of a same type, for example LVT or HVT transistors, in the same region. However, certain functions of the circuit require the contiguous joining of different types of transistors with ground planes having different biases. The design of such functions of the circuit proves to be relatively difficult because additional design constraints have to be taken into account. FIGS. 1a to 1c provide an example of pairs of transistors of different types, respectively HVT, SVT, and LVT type transistors.

FIG. 1a shows an example of a pair of HVT-type transistors, namely an nMOS transistor 1nH and a pMOS transistor 1pH. The transistors 1nH and 1pH are made with SOI technology. The transistors 1nH and 1pH are made on a silicon substrate layer 101H. The transistors 1nH and 1pH comprise respective buried insulating layers, 103nH and 103pH, separated from the substrate layer 101H by means of respective ground planes 102nH and 102pH and wells 112nH and 112pH. The insulating layers 103nH and 103pH are surmounted by an active silicon layer. The active silicon layer of the transistor 1nH comprises a source, a channel 104nH, and a drain. The active silicon layer of the transistor 1pH comprises a source, a channel 104pH, and a drain. The ground planes 102nH and 102pH enable the electrostatic control of the transistor to be improved by limiting the penetration of the electric fields generated by the drain and the source beneath the channel 104nH or 104pH. The reduction of the lateral electrostatic coupling reduces short-channel effects and limits the drain-induced depletion effect or drain-induced barrier lowering (DIBL) effect. The channels 104nH and 104pH are covered respectively with gate oxide layers 105nH and 105pH. The gate oxides 105nH and 105pH are surmounted by respective gate stacks comprising metal layers 108nH and 108pH and polysilicon layers 111nh and 111ph. The stacks are demarcated laterally by spacers 110nH and 110pH. Insulation trenches 106H, 107H and 109H are placed around the transistors 1nH and 1pH.

To obtain HVT type transistors, the ground planes have a thickness known as an ultra thin thickness, typically ranging from 10 to 100 nm. The ground plane 102nH has P-type doping and is biased to ground, and the ground plane 102pH has an N-type doping and is biased to Vdd. The wells 112nH and 112pH have respective P-type and N-type dopings. The ground planes 102nH and 102pH are biased by means of wells 112nH and 112pH respectively.

FIG. 1b shows an example of a pair of SVT-type transistors, namely an nMOS transistor 1nS and a pMOS transistor 1pS. The transistors 1nS and 1pS have substantially the same structure as the transistors 1nH and 1pH: they are made on a silicon substrate layer 101S comprising respective buried insulating layers 103nS and 103pS separated from the substrate layer 101H by means of the respective ground planes 102nS and 102pS and wells 112nS and 112pS. The insulating layers 103nS and 103pS are surmounted by an active silicon layer. The active silicon layer of the transistor 1nS has a source, a channel 104nS and a drain. The active silicon layer of the transistor 1pS has a source, a channel 104pS and a drain. The channels 104nS and 104pS are covered respectively with gate oxide layers 105nS and 105pS. The gate oxide layers 105nS and 105pS are surmounted by respective gate stacks comprising metal layers 108nS and 108pS and polysilicon layers 111nS and 111pS. The stacks are demarcated laterally by spacers 110nS and 110pS. Insulating trenches 106S, 107S and 109S are placed around the transistors 1nS and 1pS.

To obtain SVT type transistors, the ground planes have an ultra-thin thickness. The ground plane 102nS has an N-type doping and is biased to ground and the ground plane 102pS has P-type doping and is biased to Vdd. The wells 112nS and 112pS have respective P-type and N-type dopings. The biasing of the ground planes 102nS and 102pS is done by means of the wells 112nS and 112pS respectively.

FIG. 1c shows an example of a pair of LVT-type transistors, namely an nMOS transistor 1nL and a pMOS transistor 1pL. The transistors 1nL and 1pL have substantially the same structure as the transistors 1nH and 1pH: they are made on a silicon substrate layer 101L comprising respective buried insulating layers 103nL and 103pL separated from the substrate layer 101H by means of respective ground planes 102nL and 102pL and wells 112nL and 112pL. The insulating layers 103nL and 103pL are surmounted by an active silicon layer. The active silicon layer of the transistor 1nL has a source, a channel 104nL and a drain. The active silicon layer of the transistor 1pL has a source, a channel 104pL and a drain. The channels 104nL and 104pL are covered respectively with gate oxide layers 105nL and 105pL. The gate oxides 105nL and 105pL are surmounted by respective gate stacks comprising metal layers 108nL and 108pL and poly-silicon layers 111nL and 111pL. The stacks are demarcated laterally by spacers 110nL and 110pL. Insulating trenches 106L, 107L and 109L are placed around the transistors 1nL and 1pL.

To obtain LVT type transistors, the ground planes have an ultra-thin thickness. The ground plane 102nL has N-type doping and is biased to Vdd, and the ground plane 102pL has P-type doping and is biased to ground. The wells 112nL and 112pL have respective N-type and P-type dopings. The biasing of the ground planes 102nL and 102pL is done by means of the wells 112nL and 112pL respectively.

If pairs of HVT and SVT transistors can be attached together on the same row or on adjacent rows, a pair of LVT transistors, on the contrary, cannot be adjacent to a pair of HVT or SVT transistors. Indeed, it can be necessary to modify the biasing of the ground planes to ground or to Vdd. Owing to these biases and dopings of the ground planes, shorting between wells or forward-biased P-N junctions can be generated.

SUMMARY

There is therefore a need for designs of integrated circuits of an FDSOI type in which the adjacent cells have wells of a same doping with distinct biases to obtain distinct threshold voltages.

Besides, the invention generally seeks to favor the designing of integrated circuits having distinct threshold voltages.

Certain publications have proposed developments of structures of FDSOI integrated circuits. One practical problem that arises with any technological development pertaining to such circuits is that the existing design tools can prove to be incompatible or require major developments in computer software.

Thus, in industry, the electronic circuit designers working for semi-conductor manufacturers use computer-assisted design (CAD). The big circuits are indeed far too complex to be designed by hand and require appropriate computer tools, especially to avoid risks of design errors.

CAD uses a functional specification at input. This functional specification describes the desired working of the circuit as well as the non-functional constraints (such as surface area, cost, consumption, etc.). CAD then outputs a representation in the form of a computer file (generally in the GDSII format or more recently the OASIS format). This computer file defines the drawings of the masks of the integrated circuit to be made, so that the masks can be fabricated. The masks made then serve for the fabrication of the circuit in the semi-conductor manufacturing units, during the steps of photolithography. CAD is divided into several steps.

Starting from the functional specification of the circuit, the concept and overall architecture of the integrated circuit are defined in a first step. Thus, the full system (hardware and software) is modeled at a very high level so as to validate the chosen architecture in terms of performance relative to the requirements of the application. The architecture of the integrated circuit is generally designed in the Verilog, VHDL, SPICE or other languages.

Then, a floor planning or optimizing step is carried out. In this step, a plan or map is created of the locations of the logic gates on the chip, the sources and the ground connections, and the inputs/outputs and the macro-circuits (i.e., the complex components such as the processors, DSPs, memories, etc.).

Then, a logic synthesis of the circuit is made. In this step, the circuit is modeled at the register transfer level (or RTL). In RTL modeling, the implementation of the integrated circuit is described in the form of sequential elements and logic combinations between the different inputs/outputs of the sequential elements and primary inputs/outputs of the integrated circuit. The modeling gives a network formed by logic gates and rudimentary elements. This modeling is generally encoded with a dedicated language such as Verilog or VHDL. RTL modeling is automatically synthesizable in the form of combinatorial logic gates (AND, OR, multiplexer and other gates) and sequential (synchronous D latches, etc.) logic coming from a standard cell library. The location of the elements is not yet specified at this stage and takes the form of lists of elements needed to carry out the desired functions.

Then, a behavioral synthesis of the circuit is made. This is also called a high-level synthesis or algorithmic synthesis. Then, the temporal behavior of the RTL model generated is simulated. Each interconnection signal is determined as a function of input stimuli described generally in the same language as the RTL model. If the circuit to be simulated contains a processor, a corresponding executable program is defined in the form of binary memory content. The memory containing the program code and the data (FLASH, or SRAM for example) can also be modeled with a same language but at a level of abstraction higher than RTL.

The algorithmic synthesis is not necessarily sufficient to ensure the absence of design errors for the following reasons: the generation of the stimuli is done by the designer and does not allow for performing exhaustive functional tests for reasons of time; and the logic simulators are relatively slow. For a complex circuit, several days of simulation may be needed and this limits the number of simulations that can be made.

During a step of logic synthesis, the RTL model of the circuit is converted into a description at the level of the logic gates i.e. the gate netlist is generated. A library of logic gates is available for this purpose. This library is generally a collection of several hundreds of logic elements (such as AND gates, OR gates, flip-flop circuits, etc). This library depends on the fineness of etching of the circuit (for example 32 nm or 22 nm) and cell design rules depending on the manufacturer's method of fabrication.

The user must also furnish logic synthesis constraints such as frequency of operation of the circuit, its conditions (range of supply voltage, temperature range, variations in gate crossing times related to fabrication methods), time constraints for starting and arriving at the primary and secondary inputs of the circuit, the charging model linked to the interconnection wires which will connect the gates or the maximum size of the circuit on the silicon substrate.

The synthesis tools generally work on synchronous digital integrated circuits, the sequential elements of which are clocked by a single clock. As the case may be, there can be several clock domains combining a set of sequential and combinational elements. The logic synthesis tool of a synchronous circuit generally proceeds in several steps: the RTL model is converted into generic combinational and sequential logic elements (independently of the target library) following mathematical algorithms;

the generic logic elements are replaced by those coming from the target library. To this end, the tool chooses the logic elements complying with the time and space constraints given by the user. Analytical computations of time limits are then performed on all the logic paths of the circuit so as to make sure that they comply with the time constraints (frequency of operation of the circuit). If the results are not conclusive, the tool tries to use other gates available in the library to arrive at the desired result. It is thus common in a library to have numerous gates fulfilling the same logic function but with different sizes and fan-out values; when the time constraints are fulfilled, the synthesis tool has certain time margins available on certain paths. It can then optimize the designing of the circuit by replacing certain gates by others that consume less intensively and need less silicon area while at the same time continuing to comply with time constraints.

The logic synthesis provides a computer file representing the instantiation of the gates of the target library and their interconnection and representing the integrated circuit (this is the gate netlist). There are different formats of this type of representation, especially the Verilog format, the VHDL format or the EDIF format.

The logic synthesis is followed by a step of placing and routing. During this step, the different components of the integrated circuit defined in the gate netlist are automatically placed and connected according to the problem to be resolved. Placing and routing is a difficult optimization problem that requires metaheuristic techniques.

Logic synthesis can require a lengthy and tedious re-definition of novel components. Placing/routing can prove to be particularly sensitive to the re-definition of novel components.

The invention seeks to resolve one or more of these drawbacks. The invention thus pertains to an integrated circuit comprising a stack consisting of a semi-conductor substrate with a first type of doping, an UTBOX type buried insulating layer and a semi-conductor layer, and comprising:
  first and second electronic components formed in and/or on said semi-conductor layer;
  first and second ground planes beneath the buried insulating layer so as to be respectively plumb with the first and second electronic components;
  first and second wells with the first type of doping disposed respectively beneath the first and second ground planes.

The first and second wells are separated from the semi-conductor substrate by a deeply buried well or deep well with a second type of doping.

The first and second wells are separated from each other by a lateral well having the second type of doping and/or by a block constituted by an insulating material.

The integrated circuit comprises a bias circuit enabling distinct voltages to be applied to the first and second ground planes by means of said first and second wells.

According to one variant, the first and second wells are separated from each other by a block constituted by an insulating material.

According to yet another variant, the block extends up to the deep well.

According to another variant, the block extends up to the first and second wells but not up to the deep well, and the block overhangs the lateral well presenting the second type of doping and separating the first and second wells.

According to yet another variant, the first and second wells are separated from each other by a lateral well having the second type of doping.

According to one variant, a block of insulating material separates the first and second electronic components at the semi-conductive layer level, said block of insulating material being formed so as to be plumb with said lateral well, the lateral well extending from the buried insulating layer up to the deep well.

According to another variant, said first electronic component is a first FDSOI type transistor and the second electronic component is a second FDSOI type transistor, one among the first or second transistors being of an nMOS type, the other among the first or second transistors being of a pMOS type.

According to yet another variant, the integrated circuit comprises:
  a third transistor formed in and/or on said semi-conductor layer and being of the same type as the second transistor;
  a third ground plane disposed beneath the buried insulating layer plumb with the third electronic component;
  a third well with the first type of doping disposed beneath the third ground plane in the continuity of the second well.

According to yet another variant, the third ground plane is of a type opposite that of the second ground plane.

According to one variant, the third ground plane is of the same type as the second ground plane.

According to another variant, a block of insulating material separates the second and third transistors at the semi-conductor layer level.

According to yet another variant, the block of insulating material does not reach the second and third wells.

According to yet another variant, the first ground plane has the second type of doping and is separated from the lateral band by an additional lateral band having the first type of doping.

According to one variant, the block of insulating material reaches the second and third wells but does not reach the deep well.

According to yet another variant, the first and second electronic components are first and second transistors belonging to a SRAM memory cell.

According to another variant, the buried insulating layer has a thickness smaller than 50 nm and the width of the gate of the transistors is smaller than 50 nm.

DESCRIPTION OF THE DRAWINGS

Other features and advantages of the invention shall appear from the following description given by way of an indication that is in no way exhaustive, with reference to the appended drawings, of which:

FIG. 9 is another example of a portion of a circuit according to the invention designed with other types of standard cells;

FIG. 10 is another example of a portion of a circuit designed according to the invention with standard cells;

FIG. 11 is a graph illustrating the depletion width in a well as a function of its depth and its bias voltage;

DETAILED DESCRIPTION

In general, the invention seeks to favor the designing of integrated circuits having distinct threshold voltages.

The invention proposes on the one hand an integrated circuit having two adjacent cells. The first cell comprises an nMOS transistor and a pMOS transistor of an FDSOI type. The second cell comprises an nMOS transistor and a pMOS transistor of an FDSOI type. These transistors have ground planes and respective wells separating an ultra-thin buried oxide layer (UTBOX) of the semi-conductor substrate.

The ground planes of the transistors of a same cell have respective P and N dopings. The wells of the transistors of a same cell have respective P and N dopings. A bias circuit is configured to apply distinct voltages to said P-doped wells.

The P doped well of one of the the transistors of the second cell is separated from the first cell and the semi-conductor substrate by a deeply buried N-doped separation well.

With a simple structure and design rules requiring minimum adaptation of the existing tools of computer-assisted design, the invention enables transistors of very different types to be attached together, these transistors having bias values and dopings that are distinct from their ground plane to obtain distinct voltage thresholds in order to meet different design constraints.

Figure 2:
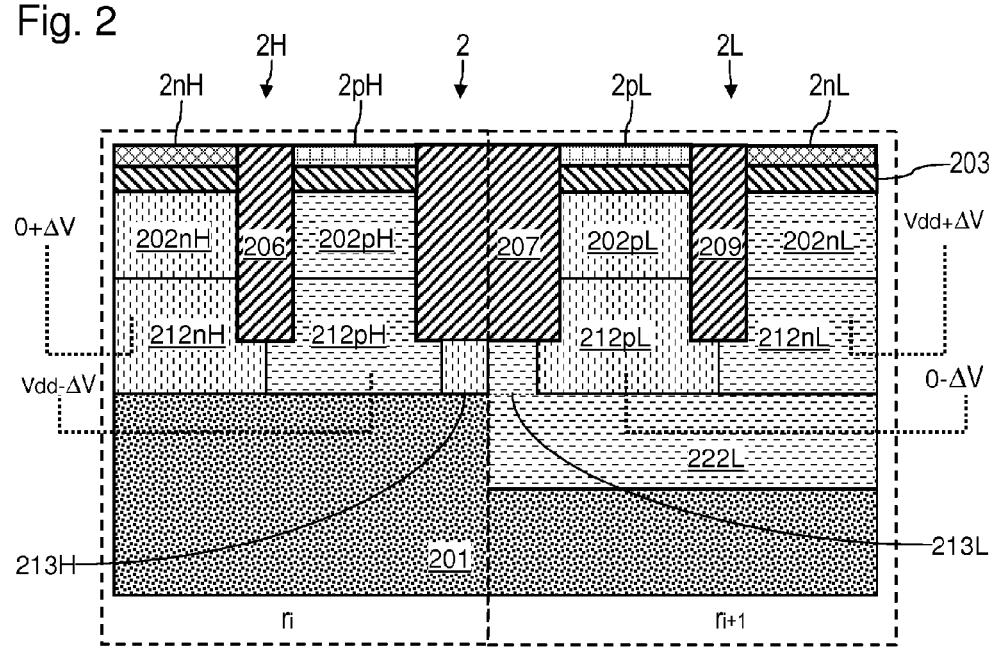
FIG. 2 is a view in section of an integrated circuit according to a first embodiment of the invention.

FIG. 2 is a view in cross-section of two cells disposed in adjacent rows $r_i$ and $r_{i+1}$ of an integrated circuit 2 in a first embodiment of the invention. The longitudinal direction will define the direction of extension of the rows and the transversal or crosswise direction will define the direction in the plane of the substrate perpendicular to the longitudinal direction. The integrated circuit comprises first and second FDSOI transistor cells.

The first cell 2H comprises an nMOS transistor 2nH attached to a pMOS transistor 2pH. The transistors of the first cell are of a first type, typically of an HVT type, i.e. with a high voltage threshold.

The second cell 2L comprises an nMOS transistor 2nL attached to a pMOS transistor 2pL. The transistors of the second cell are of a second type, typically of an LVT type, i.e. with a low voltage threshold.

The nMOS transistors of the different cells of the same row are aligned. The pMOS transistors of different cells of the same row are also aligned.

Figure 1A:
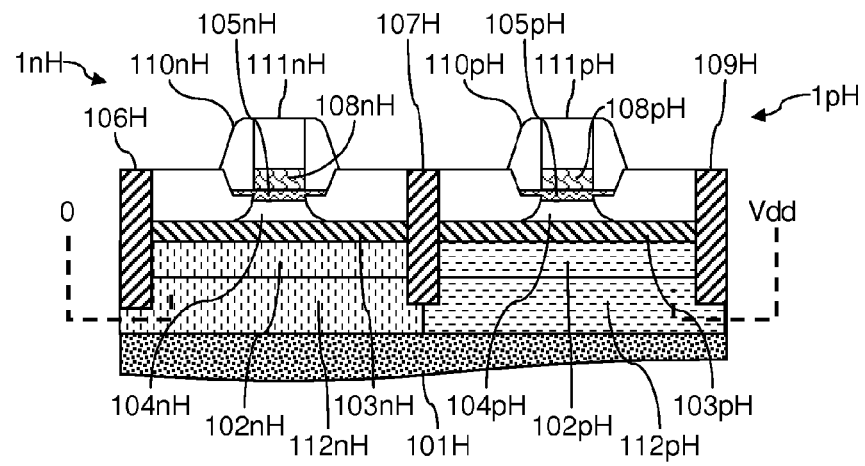
FIGS. 1a to 1c are views in section of pairs of FDSOI transistors of different types according to the prior art.
Figure 1B:
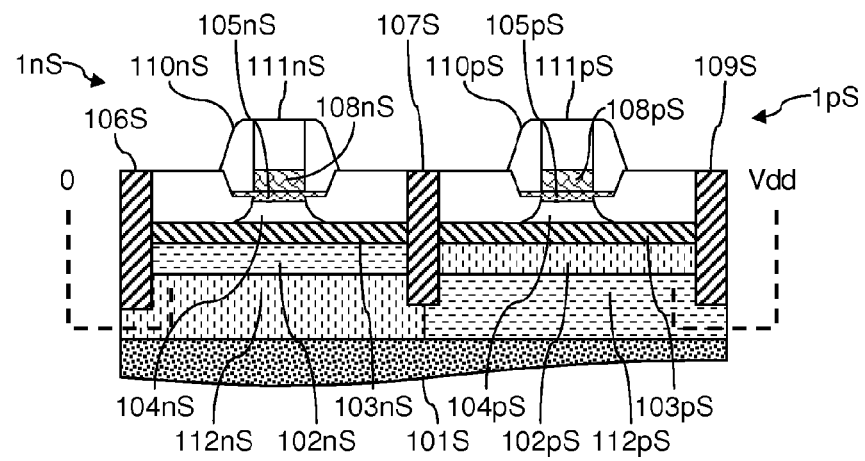
Figure 1C:
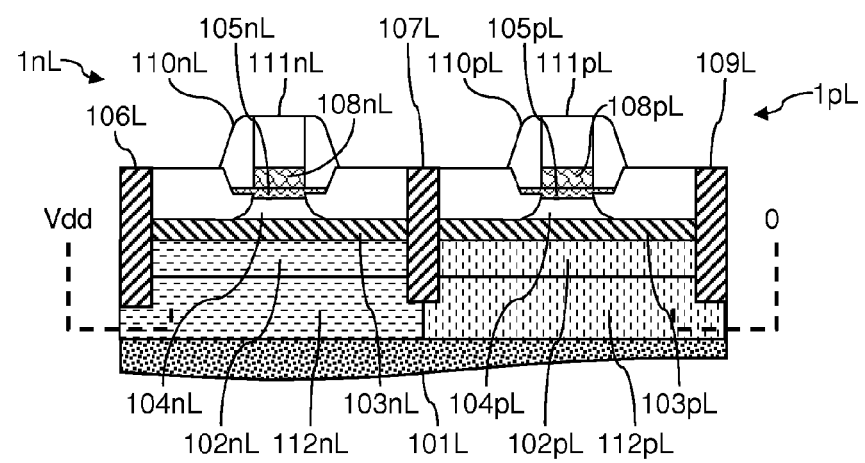

In a known manner, the transistors of the first and second cells comprise a buried insulator layer 203 made so as to be plumb with a P-type silicon substrate 201 and surmounted by an active silicon layer. The active layer of the transistors has a known structure that is shown only schematically for the sake of simplification. For example, the structures of active layers described in detail with reference to FIGS. 1a, 1b and 1c could be used. The active silicon layer of each transistor has a source, a channel and a drain. The transistors are made with FDSOI technology and the doping of the channel is therefore almost zero and substantially equal to the doping of the substrate 201. The substrate 201 has for example a doping of $3*10^{15}$ cm$^{-3}$. The channel of a transistor is lined with a gate oxide layer. The gate oxide is surmounted by a stack of gates comprising a metal layer (typically having a width smaller than 50 nm) and a polysilicon layer. The stack is demarcated laterally by spacers. The transistors are separated by isolating trenches 206, 207 and 209.

The transistors 2nH and 2pL comprise ground planes 202nH and 202pL and wells 212nH and 212pL, with P-type doping disposed so as to be plumb with the buried insulator layer 203. The transistors 2pH and 2nL comprise ground planes 202pH and 202nL, and wells 212pH and 212nL, with N-type doping disposed so as to be plumb with the layer of buried insulator 203. The ground planes 202nH, 202pH, 202pL and 202nL are prepared respectively on the wells 212nH, 212pH, 212pL and 212nL. The ground planes 202nH, 202pH, 202pL and 202nL extend in depth up to an intermediate level of the insulating trenches 206, 207 and 209. The wells 212nH, 212pH, 212pL and 212nL extend from the ground planes 202nH, 202pH, 202pL and 202nL until they are beneath the insulation trenches 206, 207 and 209. The ground planes and the wells can have a doping of $10^{18}$ cm$^{-3}$. The wells 212pL and 212pH are adjacent. The wells are biased by connections that are not shown. Each ground plane makes it possible to improve the electrostatic control of its transistor by limiting the penetration of the electric fields generated by the drain and the source beneath the channel. The reduction of the lateral electrostatic coupling reduces short-channel effects and limits the drain-induced depletion effect or drain-induced barrier lowering (DIBL) effect.

A bias circuit (not shown) is configured to enable the application of a ground voltage to the ground planes 202nH, 202pL by means of the wells 212nH and 212pL respectively. The bias circuit is also configured to enable the application of a voltage Vdd to the ground planes 202pH, 202nL, by means of the wells 212pH and 212nL respectively.

In order to enable a modulation of the threshold voltage of the transistors by playing on the biases and the doping of the ground planes, the buried insulating layer 203 is of the UTBOX type, this type of layer typically having a thickness of less than 50 nm. The insulating layer 203 can for example be made of silicon oxide.

With a layer of buried insulator of the UTBOX type, and with the biases and the dopings of the ground planes mentioned, the transistors 2nH and 2pH have raised threshold voltages and the transistors 2nL and 2pL have lowered threshold voltages.

In the example illustrated in FIG. 2, the ground planes of the cells are subjected to a FBB bias (or forward back biasing). The bias circuit of the ground planes is thus configured to modulate the voltages applied to the ground planes relative to the ground voltage or the voltage Vdd. In the illustrated example, the biasing of the ground planes 202nH and 202nL is thus increased by a voltage $\Delta V$ and the biasing of the ground planes 202pH and 202pL is reduced by a voltage $\Delta V$. The following biases are thus applied:

202nH: 0+ΔV
202pH: Vdd−ΔV
202pL: 0−ΔV
202nL: Vdd+ΔV

Thus, the P-doped wells of the two cells are biased with distinct voltages. Depending on the value of ΔV, there is a risk of the wells 212nH and 212pL being shorted through the substrate 201.

In order to prevent such shorting, one of the P-doped well transistors is separated from the substrate 201 by means of a deeply buried well or deep well with N-type doping. In the example illustrated in FIG. 2, the deep well with N-type doping 222L is disposed so as to be plumb with the well 212pL. The deep well with N-type doping 222L also separates the well 212pL from the adjacent cell 2H so as to thus eliminate the risks of shorting or of a P-N junction forward biased with the cell 2H. The deep well with N-type doping 222L comprises a part 213L forming a band that projects crosswise to the adjacent cell relative to the well 212pL. At the longitudinal ends of the cell 2L, the band 213L extends crosswise (for example in a transition cell) so that the well 212pL is surrounded by the well 212nL and the N-doped well 222L. One example of a sizing of the width of this part 213L will be described in detail here below. The deep well 222L can, for example, be implanted up to a depth of more than 200 nm, typically of the order of 500 nm, beneath the layer 203. The use of a deep well 222L enables the making of an insulation of the ground plane 202pL relative to the adjacent cell up to a very great depth.

The well 212pH is furthermore separated from the well 212pL by means of a band 213H with P-type doping (formed by a P-doped buried well) extending longitudinally. This band 213H projects crosswise relative to the well 212pH and is attached to the band 213L. At the longitudinal ends of the cell 2H, the band 213H extends crosswise (for example in a transition cell) so that the well 212pH is surrounded by a P-doped well.

The bias circuit can also be configured to apply the following biases to the ground planes (FBB on the cell 2H and the cell 2L):

202nH: 0+ΔV
202pH: Vdd−ΔV
202pL: 0+ΔV
202nL: Vdd−ΔV

To avoid having to make forward-biased P-N junctions between the wells, the invention uses a maximum value ΔV of Vdd/2. Thus, with such a biasing, the difference in potential of a P-N junction is at the most equal to −2*Vdd. The minimum width $W_{min}$ of the bands 213L and 213H preventing a forward bias of a P-N junction will be defined by the grade of the mask used for the implanting of the wells. This grade of mask is generally defined by a compromise between the fineness of etching and the cost. For the 32 nm technological node, the minimum width permitted by the Design Rule Manual (DRM) is 270 nm. However, this value can be smaller with an implantation method optimized for FDSOI technology.

With a Vdd value of 0.9V, for a technological node sized 22 nm and a buried well doping of $10^{18}$ cm$^{-3}$, numerical simulations show that the bands 213H and 213L having a width of two track pitches, namely 80 nm, prove to be sufficient. For rows initially having a width of 12 track pitches, the rows made with cells according to the invention have an increase in surface of the substrate limited to about 14%. A width of the bands 213H and 213L greater than 10% of the width of the row could prove to be satisfactory in most cases to prevent the bands 213H and 213L from being completely depleted.

Simulations show that the implantation of the buried well with a doping of $10^{18}$ cm$^{-3}$ can easily be made up to 700 nm for this size of technological node. FIG. 11 represents the depletion value $W_{dep}$ as a function of the depth DnWd of the buried well for different values of the voltage Vdd. This graph shows that a width of the bands 213H and 213L of two track pitches proves to be sufficient to obtain an implantation of the buried well of up to 650 nm beneath the oxide layer for these different bias values and to prevent the bands 213H and 213L from being completely depleted.

Even if a width of the bands 213H and 213L is smaller than these recommendations, this has no impact on the functioning: indeed, if these bands are completely depleted, they behave like an extension in depth of the insulation trenches.

The ground planes, the wells and the deep wells could be made during different steps of the fabrication method. The implantation of the wells will favor homogeneity of the charges. The implantation of the ground planes will favor the doping at the interface with the layer of buried insulator.

Figure 3:
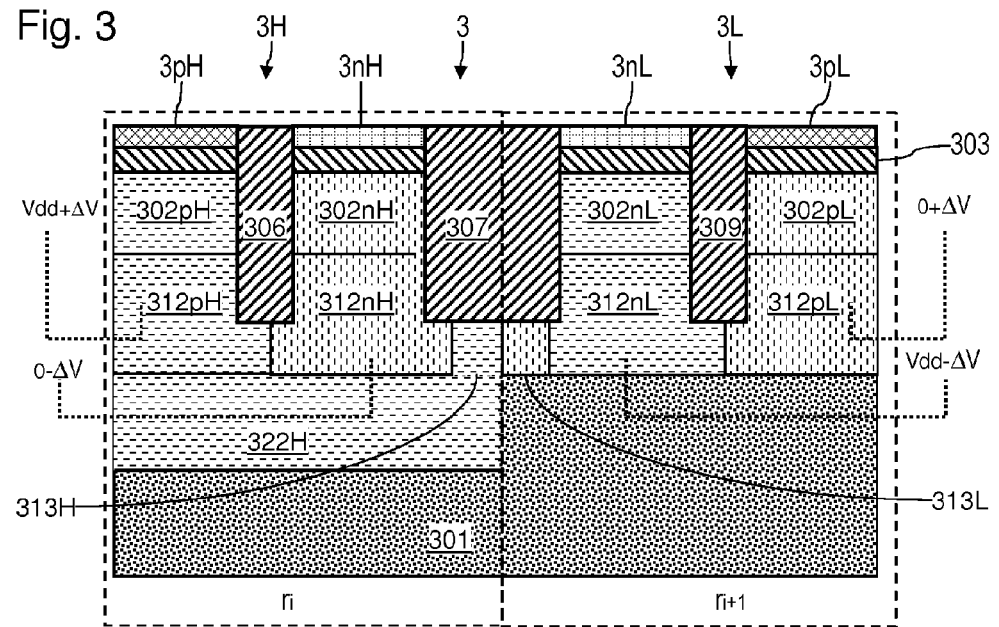
FIG. 3 is a view in section of an integrated circuit according to a second embodiment of the invention.
Figure 4A:
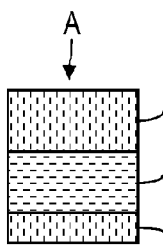
FIGS. 4a, 4b, 5a, 5b, 6a, 6b, 7a and 7b are schematic views of standard cells according to the first embodiment for a library of a placing/routing software for computer-assisted designing of the integrated circuit.
Figure 4B:
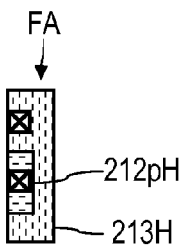
Figure 5A:
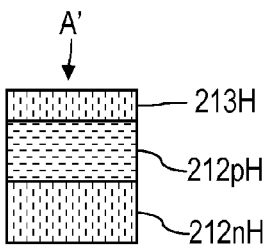
Figure 5B:
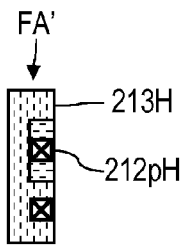
Figure 6A:
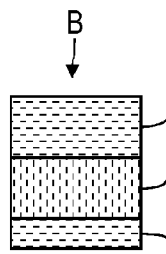
Figure 6B:
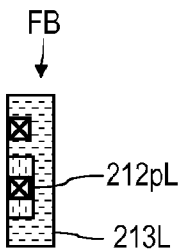
Figure 7A:
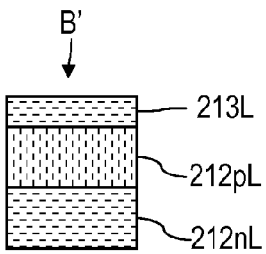
Figure 7B:
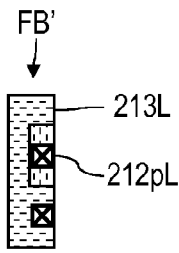

FIG. 3 is a view in cross-section of two cells disposed in adjacent rows $r_i$ and $r_{i+1}$ of a integrated circuit 3 according to a second embodiment of the invention. The integrated circuit 3 comprises first and second FDSOI transistor cells.

The first cell 3H comprises an nMOS transistor 3nH attached to a pMOS transistor 3pH. The transistors of the first cell are of a first type, typically of an HVT type, i.e. with a high voltage threshold.

The second cell 3L comprises an nMOS transistor 3nL attached to a pMOS transistor 3pL. The transistors of the second cell are of a second type, typically of an LVT type, i.e. with a low voltage threshold.

The transistors of the first and second cells comprise a layer of buried insulator 303 made so as to be plumb with a P-type silicon substrate 301 and surmounted by an active silicon layer. The active layer of the transistors has a known structure that is represented only schematically for the purpose of simplification. The active silicon layer of each transistor comprises a source, a channel and a drain.

The transistors 3nH and 3pL comprise ground planes 302nH and 302pL and wells 312nH and 312pL, with P-type doping, positioned so as to be plumb with the layer of buried insulator 303. The transistors 3pH and 3nL comprise ground planes 302pH and 302nL and wells 312pH and 312nL, with N-type doping disposed so as to be plumb with the layer of buried insulator 303. The ground planes 302nH, 302pH, 302pL and 302nL are prepared respectively on wells 312nH, 312pH, 312pL and 312nL. The ground planes 302nH, 302pH, 302pL and 302nL extend in depth up to an intermediate level of the insulation trenches 306, 307 and 309. The wells 312nH, 312pH, 312pL and 312nL extend from the ground planes 302nH, 302pH, 302pL and 302nL until they are beneath the insulation trenches 306, 307 and 309. The ground planes are biased by connections that are not shown. A bias circuit, not shown, is configured to enable the application of a ground voltage to the ground planes 302nH and 302pL by means of the wells 312nH and 312pL respectively, and to enable the application of a voltage Vdd to the ground planes 302pH and 302nL, by means of wells 312pH and 312nL respectively. The layer of buried insulator 303 is of the UTBOX type.

With a layer of buried insulator of the UTBOX type, and with the biases and dopings of the ground planes mentioned above, the transistors 3nH and 3pH have raised voltage thresholds and the transistors 3nL and 3pL have lowered threshold voltages.

In the example illustrated in FIG. 3, the ground planes of the cells are subjected to an RBB or reverse back biasing. Thus, the biasing of the ground planes 302nH and 302nL is reduced by a voltage ΔV and the biasing of the ground planes 302pH and 302pL is increased by a voltage ΔV. The following biases are thus applied:

302nH: 0−ΔV
302pH: Vdd+ΔV
302pL: 0+ΔV
302nL: Vdd−ΔV

Thus, the P-doped ground planes of the two cells are biased with distinct voltages. Depending on the value of ΔV, there is a risk of the wells 312nH and 312pL being shorted through the substrate 301.

In the example illustrated in FIG. 3, a well with N-type doping 322H is disposed so as to be plumb with the well 312nH. The deep well 322H also separates the well 312nH from the adjacent cell 3L so as to thus eliminate the risks of shorting or of a P-N junction being forward biased with this cell 3L. The deep well 322H has a part 313H forming a band projecting crosswise towards the cell 3L relative to the well 312nH. At the longitudinal ends of the cell 3H, the band 313H extends crosswise.

The well 312nL is furthermore separated from the well 312nH by means of a band 313L with P-type doping (formed by a doped buried well P) extending longitudinally. This band 313L projects crosswise relative to the well 312nL and is attached to the band 313H. At the longitudinal ends of the cell 3L, the band 313L extends crosswise.

Depending on the configuration of the integrated circuit, the bias circuit can implement FBB or RBB type biases, either dynamically to modify the threshold voltages as a function of the operating context of the circuit or statically following a step of initial configuration of the integrated circuit performed during its fabrication process.

FIGS. 4a, 4b, 5a, 5b, 6a, 6b, 7a and 7b are schematic representations of standard cells designed to generate the topology of an integrated circuit according to the invention by a placing/routing application of a system of computer-assisted design. These standard cells can be included in the library of the application to generate a topology of the integrated circuit with cells according to the first embodiment. To make the drawings easier to read, the standard cells are illustrated in schematic section at the position of the wells.

The standard cell A (FIG. 4a) corresponds to the cell 2H illustrated in FIG. 2. The standard cell FA (FIG. 4b) corresponds to a transition cell that is to be placed at a longitudinal end of a standard cell A to separate it from an adjacent standard cell B of the same row. The standard cell A' (FIG. 5a) is a symmetrical version of the standard cell A. The standard cells A and A' are disposed in adjacent rows so that they can share power connectors. The standard cell FA' (FIG. 5b) corresponds to a transition cell that is to be placed at a longitudinal end of a standard cell A' to separate it from an adjacent standard cell B' of the same row. The transition cells comprise connections for biasing the ground planes of the transistors of the standard cells.

The standard cell B (FIG. 6a) corresponds to a cell of the 2L type described here above. The standard cell FB (FIG. 6b) corresponds to a transition cell that is to be placed at a longitudinal end of a standard cell B to separate it from an adjacent standard cell A of the same row. The standard cell B' (FIG. 7a) is a symmetrical version of the standard cell B and corresponds to the cell 2L illustrated in FIG. 2. The standard cells B and B' are disposed in adjacent rows in order to be able to share power connectors. The standard cell FB' (FIG. 7b) corresponds to a transition cell to be placed at a longitudinal end of a standard cell B' to separate it from an adjacent standard cell A' of the same row.

A library comprising such standard cells compliant with the invention can easily be implemented by a placing/routing application in order to define the topology of the integrated circuit. The placing/routing application can thus use these standard cells in making their length (longitudinal direction of the row) vary during their insertion into the topology of the integrated circuit, these standard cells having a same width. An existing placing/routing application can easily be modified to take account of the rules of positioning of these novel standard cells.

Figure 8:
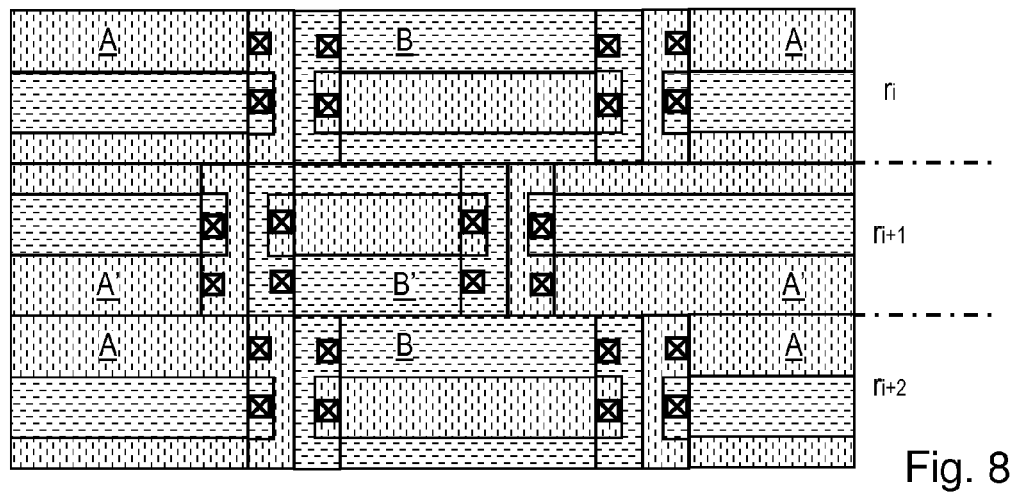
FIG. 8 is an example of a portion of a circuit according to the invention designed with the standard cells.

FIG. 8 gives an example of a topology of an integrated circuit prepared with such standard cells. To generate this topology, the placing/routing application will typically use the width of these standard cells to define the width of the rows in which these standard cells will be disposed. Owing to the insulation obtained by the N-type deep wells of these cells, shorting currents between ground planes are prevented both between adjacent rows and between adjacent cells of a same row. Thus, as illustrated in FIG. 8, the cells of the different rows are not necessarily aligned in columns.

FIG. 9 gives another example of topology of an integrated circuit with other types of standard cells. The standard cells have the same width as the prior-art standard cells. The standard cells A and B (as well as A' and B') include transistors. These standard cells are insulated from one another only at their longitudinal ends by means of transition cells FAB and FBA (or FAB' and FBA'). A standard cell A or A' is thus not separated by a buried well from a standard cell B or B' of an adjacent row. To this end, the cells B and B' are aligned in columns. Similarly, the cells A and A' are aligned in columns. The standard cells of a same column thus have a same length. This prevents shorting between P-doped ground planes by simply using the transition cells FAB, FBA, FAB' and FBA'. Such a topology makes it possible to obtain an integrated circuit according to the invention with a silicon surface substantially equivalent to that of a prior-art integrated circuit.

FIG. 10 schematically illustrates the disposition of standard cells in an integrated circuit topology. Repetition cells Wt (known as well taps) are disposed at regular intervals in the rows by the placing/routing application in a known manner. The placing/routing application positions the standard cells A, A', B and B' between these well taps Wt and interposes transition cells FAB, FAB', FBA and FBA' between standard cells A and B or between standard cells A' and B'.

Different methods for generating a topology of integrated circuits according to the invention can be envisaged in order to define the geometry of the masks used during the fabrication process. The steps prior to the placing/routing are known and shall not be described in further detail.

According to a first variant, in a known manner, the placing/routing application can define a floor plan and then add the power rails. The placing/routing application can then position standard cells integrating bands 213L and 213H that project crosswise as illustrated in FIGS. 4a, 5a, 6a and 7a. The placing/routing application can then position transition cells as illustrated in FIGS. 4b, 5b, 6b and 7b between the standard cells. The placing/routing application can then dispose the well taps at regular intervals. The clock tree can then be obtained before defining the routing by a filling of interstices between standard cells with filler cells. This variant makes it possible advantageously for the placing/routing application to generate the topology in using the usual rules for positioning standard cells.

According to a second variant, the placing/routing application can define a floor plan and then add the power rails. The placing/routing application can then position standard cells having no bands 213L or 213H (or 313L, 313H) that project crosswise, such as standard cells illustrated in FIG. 9. The placing/routing application can then position corresponding transition cells between the standard cells. The placing/routing application can then dispose the well taps at regular intervals. The clock tree can then be made. The routing can then be defined, followed by a filling of interstices between standard cells by filler cells. The placing/routing application then interposes two crosswise separation bands respectively with N and P doping between certain adjacent rows.

This variant advantageously enables the placing/routing application to preliminarily place standard cells according to the invention having the same width as the prior-art standard cells before disposing separation bands crosswise only when this is necessary.

In most cases, the region of the integrated circuit including cells of different types (i.e. having P-doped wells that are distinctly biased) will have a proportion of cells of a first type that is much greater than the proportion of cells of a second type.

In this case, the placing/routing application could, for example, preliminarily place the cells of the second type (minority cells) and then place all the cells of the first type (majority cells). The placing process could thus be accelerated, most of the cells of the first type being not adjacent to cells of the second type and thus having ewer placement constraints.

Naturally, the placing/routing application could also preliminarily place the cells of the first type and then modify the placing of these cells to introduce the minority cells of the second type.

In the designing of the integrated circuit, the minority cells could, for example, be selected when local time constraints appear during the logic synthesis of the integrated circuit.

The examples illustrated in FIGS. 12 to 15 are intended to facilitate the integration of different components while at the same time to benefit from a great ability to modulate the threshold voltages of the different components. In order to favor their integration, the components in each of these embodiments have ground planes arranged in the respective wells with a first type of doping. This type of doping is identical to that of the semi-conductor substrate. These wells are separated from the semi-conductor substrate by respective deep wells with doping of a second type opposite the doping of the first type. The wells with doping of the first type are separated by an insulating material. Thus, at least two of these components can dispose of ground planes having distinct biases without requiring a major negative biasing of the semi-conductor substrate in order to avoid forward biased P-N junctions.

In addition, these examples are particularly suited to topology-generating methods widely used for bulk technology. In these examples, it is possible especially to use the same standard cell libraries as in the case of bulk technology. When generating the masks, it is enough to make minor changes to convert the bulk masks into masks suited to FDSOI technology.

Figure 12:
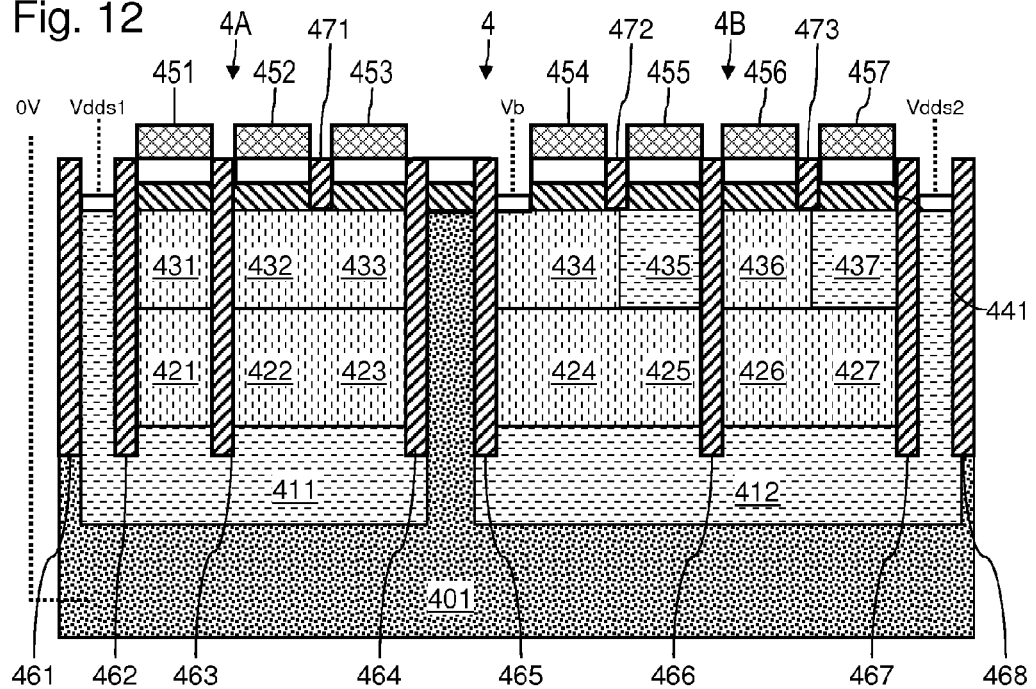
FIGS. 12 to 15 are different views in section of variants of integrated circuits according to the invention.

FIG. 12 illustrates an integrated circuit 4 including a zone 4A comprising SRAM-type memory cells and a zone 4B comprising logic gates. The zone 4A comprises transistors each comprising a gate stack 451 (corresponding to a pMOS transistor), 452 or 453 (corresponding to nMOS transistors). The zone 4B comprises especially transistors each comprising a gate stack 454, 455 (corresponding to nMOS transistors), 456 or 457 (corresponding to pMOS transistors). The transistors of the zones 4A and 4B are made so as to be plumb with an ultra-thin buried insulating layer 441. The gate stacks 451 to 457 are made so as to be plumb with the respective ground planes 431 to 437. In this example, the ground planes 431 to 434 and 436 comprise a P-type doping and the ground planes 435 and 437 comprise an N-type doping. The ground planes 431 to 437 are made on respective wells 421 to 427.

The wells 421 to 427 have a doping of a same type, in this case of a P-type. The wells 421 to 423 are made on a deep well 411 of an opposite type to that of the wells 421 to 423 which, in this instance, are of an N-type. The wells 424 to 427 are made on a deep well 412 of a type opposite that of the wells 424 to 427, thus of an N-type in this instance. The wells 411 and 412 are made in the semi-conductor substrate 401 of a same type as the wells 421 to 427, i.e. of a P-type. The wells 411 and 412 are separated from each other by the semi-conductor substrate 401. The deep wells 411 and 412 can thus be biased distinctly. The ground planes of the zone 4A can, for example, be biased at voltages different from those of the ground planes of the zone 4B.

An N-type junction extends between a contact pad and the deep well 411. This junction is made between two insulation trenches 461 and 462. The ground plane 431 and the well 421 are made between insulation trenches 462 and 463 that extend from the insulation layer 441 up to the deep well 411. The ground planes 432 and 433, as well as the wells 422 and 423, are made between the insulation trench 463 and the insulation trench 464 that extends from the insulation layer 441 up the deep well 411. The biasing of the ground plane 431 and of the well 421 and of the ground planes 432, 433 and of the wells 422, 423 can thus be dissociated.

An N-type junction extends between a contact pad and the deep well 412. This junction is made between two insulation trenches 467 and 468. The ground planes 436 and 437 and the wells 426 and 427 are made between the insulation trench 467 and an insulation trench 466 that extends from the insulation layer 441 up to the deep well 412. The ground planes 434 and 435 and wells 424 and 425 are prepared between the insulation trench 466 and an insulation trench 465 that extends from the insulation layer 441 up to the deep well 412. The biasing of the ground planes 436, 437 and of the wells 426, 427 on the one hand and the ground planes 434, 435 and the wells 424, 425 on the other hand can thus be dissociated.

The stacks 452 and 453 are separated by an insulation well 471 extending up to the ground planes 432 and 433. The ground planes 432 and 433 can thus share the same bias. The stacks 454 and 455 are separated by an insulation well 472 extending up to the ground planes 434 and 435. The ground planes 434 and 435 can thus share the same bias. The stacks 456 and 457 are separated by an insulation well 473 extending up to the ground planes 436 and 437. The ground planes 436 and 437 can thus share the same bias.

The deep well 411 is biased to voltage Vdds1 by means of an N-type junction and a contact pad. The deep well 412 is biased to voltage Vdds2 by means of an N-type junction and a contact pad. The ground plane 434 (and therefore the ground plane 435) is biased to voltage Vb by means of a contact pad. The biasing of the ground planes 431 to 433 and 436, 437 is not illustrated but can be different from the biasing Vb.

With such an integrated circuit 4:
 the set of transistors are made plumb with the wells of a same type (P) thus facilitating the fabrication process;
 owing to the use of deep insulation trenches, which extend up to the deep wells, distinct biases can be applied on certain adjacent ground planes, typically for different types of transistors;
 owing to the use of shallow insulation trenches, which extend only up to the ground plane, identical biases can be applied to certain adjacent ground planes by means of a common contact pad, typically for transistors of the same type;

owing to the use of the deep wells 411 and 412, it is not necessary to apply a highly negative voltage to the substrate 401 to prevent forward biased conductive junctions but rather, it is enough to make sure that the voltage applied to the deep wells 411 and 412 is higher than the maximum voltage that can be applied to the different ground planes, a bias to ground proving, for example, to be possible for the entire integrated circuit 4, which make the design of the circuit even closer to that of a bulk type design;

both types of distinct insulation trenches can be obtained by means of only two etching masks; and the insulation between the deep wells 411 and 412 enables the application of different biases to them so as to better insulate the memory cells from the logic gates.

With sufficiently high values of the bias voltages Vdds1 and Vdds2, there is a wide range available of variations of the bias voltages for the ground planes 431 to 437.

Figure 13:
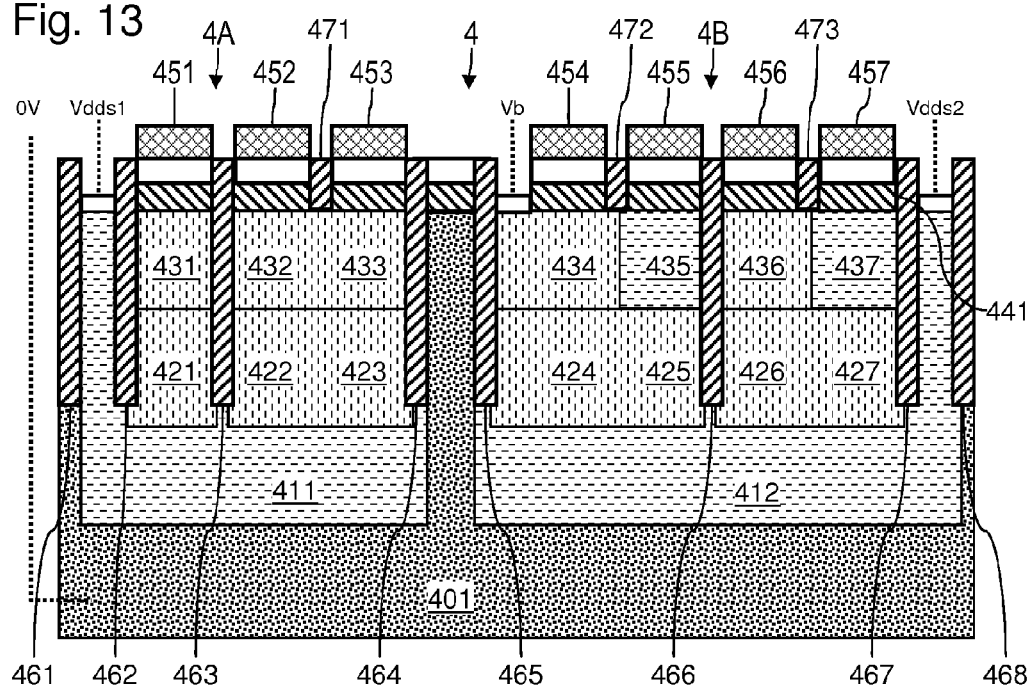

FIG. 13 illustrates an integrated circuit 4 according to one variant of the integrated circuit of FIG. 12. This variant differs from the previous one in the following characteristics:

the insulation trenches 461 to 468 extend in depth up to the two wells 421 to 427 without reaching the deep wells 411 and 412;

the well 421 and the well 422 are separated laterally by an N-type semi-conductor band;

the well 425 and the well 426 are separated laterally by an N-type semi-conductor band; and the well 423 and the well 424 are separated laterally from the substrate 401 by means of respective N-type semi-conductor bands N-type.

The N-type semi-conductor bands ensuring a lateral separation are typically residues of the step for implantation of the deep wells 411 and 412. This makes it possible to avoid using specific etching masks. These lateral separation bands have a width sufficient to prevent the formation of untimely shorting.

For the example of FIGS. 12 and 13, the method for the automated generation of the topology of the etching masks can begin with making a logic synthesis model of the integrated circuit 4 from a library of standard cells in bulk technology. The adjacent rows of transistors then comprise an alternation of N-type wells and P-type wells. The logic synthesis model is then converted to integrate an ultra-thin buried insulating layer and ground planes. Shallow insulation trenches are then placed longitudinally between the transistors of the same row. Deep insulation trenches are then disposed between the rows with N-type wells and the rows with P-type wells. The N-type wells are then systematically replaced by P-type wells. These variations can thus be designed with design tools known in bulk technology, using particularly simple conversion algorithms.

Figure 14:
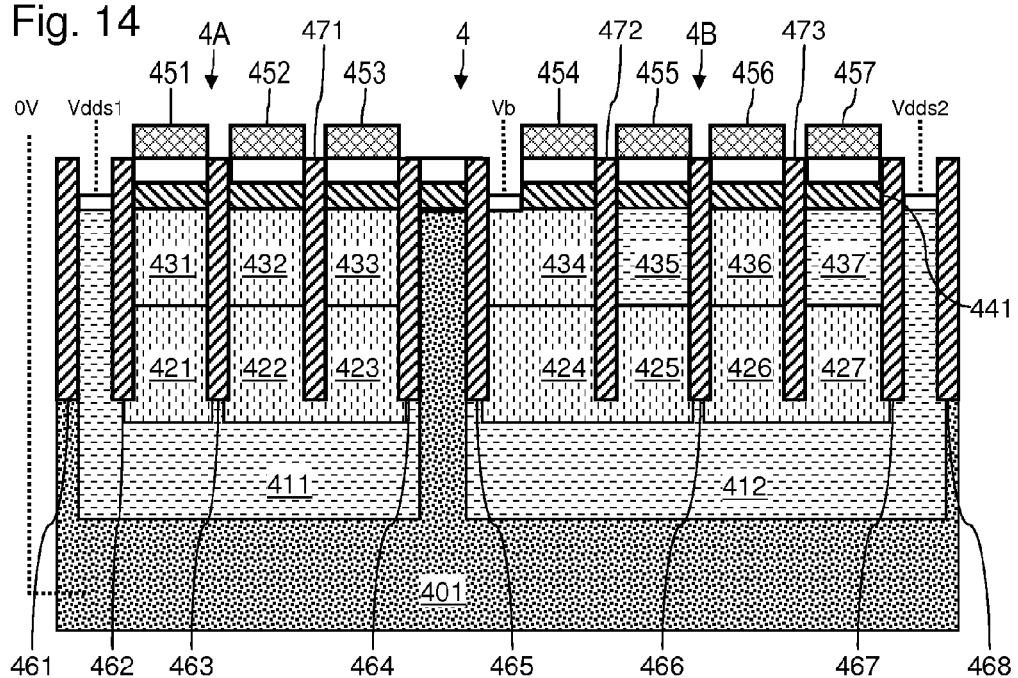

FIG. 14 illustrates an integrated circuit 4 according to a variant of the integrated circuit of FIG. 12. This variant differs from that of FIG. 12 by the following characteristics:

the insulation trenches 461 to 468 extend in depth up to the wells 421 to 427 without reaching the deep wells 411 and 412;

the insulation trenches 471 to 473 extend in depth up to the wells 421 to 427 without reaching the deep wells 411 and 412;

the well 421 and the well 422 are separated laterally by an N-type semi-conductor band;

the well 425 and the well 426 are separated laterally by an N-type semi-conductor band; and the well 423 and the well 424 are separated laterally from the substrate 401 by means of respective N-type semi-conductor bands.

The N-type semi-conductor bands ensuring lateral separation are typically residues of the step of implantation of the deep wells 411 and 412. This makes it possible to avoid using specific etching masks. These lateral separation bands have a width sufficient to prevent the formation of untimely short circuits.

For the example of FIG. 14, the method of automated generation of the topology of the etching masks can begin with making a logic synthesis model of the integrated circuit 4 from a library of standard cells in bulk technology. The rows of adjacent transistors then comprise an alternation of N-type wells and P-type wells. The logic synthesis model is then converted to integrate an ultra-thin buried insulating layer and ground planes. Deep insulation trenches are placed longitudinally between the transistors of a same row. Deep insulation trenches are then disposed between the rows of N-type wells and the rows of P-type wells. The N-type wells are then routinely replaced by P-type wells.

Figure 15:
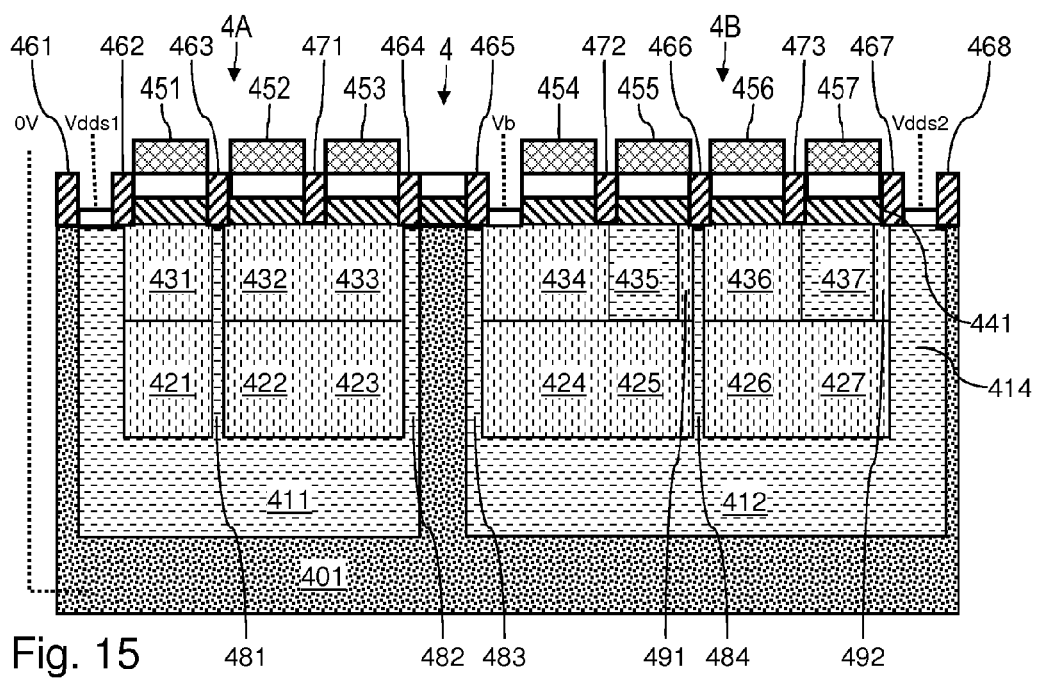

FIG. 15 illustrates an integrated circuit 4 according to another variant of the integrated circuit of FIG. 12. This variant differs from that of FIG. 12 by the following characteristics:

the insulation trenches 461 to 468 extend in depth up to the ground planes 431 to 437 without reaching the wells 421 to 427;

the well 421 and the ground plane 431 are separated laterally from the well 422 and the ground plane 432 by an N-type semi-conductor band 481;

the well 425 and the ground plane 435 are separated laterally from the well 426 and the ground plane 436 by an N-type semi-conductor band 484;

the well 423 and the ground plane 433 are separated laterally from the substrate 401 by means of an N-type semi-conductor band 482;

the well 424 and the ground plane 434 are separated laterally from the substrate 401 by means of an N-type semi-conductor band 483;

the ground plane 435 is separated laterally from the band 484 by means of a P-type lateral band 491 made out of the same layer as the ground plane 434; and the ground plane 437 is separated laterally from the junction 414 by means of a P-type lateral band 492 made in the same layer as the ground plane 436 The lateral separation bands 481, 484, 491 and 492 have a width sufficient to prevent the formation of untimely short circuits.

For the example of FIG. 15, the method for the automated generation of the topology of etching masks can be the following: initially, a logic synthesis model of the integrated circuit 4 is made from a library of standard cells in bulk technology. The adjacent rows of transistors then comprise an alternation of N-type wells and P-type wells. The logic synthesis model is then converted to integrate an ultra-thin buried insulating layer and ground planes. Shallow insulation trenches are placed longitudinally between the transistors of a same row and shallow insulation trenches are disposed between the rows of N-type wells and the rows of P-type wells. N-doped lateral separators are positioned for each row. A P-type lateral separator is positioned for each N-doped ground plane. The N-type wells are then routinely replaced by P-type wells.

In the examples of FIGS. 12 to 15, with a biasing of the deep wells at a voltage Vdds, the biasing voltages of the ground planes of the transistors can be modulated as follows:

For an nMOS transistor:
in FBB type biasing, Vb is greater than 0, and the ground plane is biased at Vb=0+ΔV, with ΔV≤Vdds; and
in RBB type biasing, Vb is smaller than 0, and the ground plane is biased at Vb=0−ΔV, with ΔV≤|Vbd|−Vdds, Vbd being the reverse breakdown voltage of the P-N junction.

For a pMOS transistor:
in FBB type biasing, Vb is smaller than Vdd, and the ground plane is biased at Vb=Vdd−ΔΔV, with ΔV≤|Vbd−Vdds+Vdd;
in RBB type biasing, Vb is greater than Vdd, and the ground plane is biased at Vb=Vdd+ΔV, with ΔV≤Vdds−Vdd.

Figure 16:
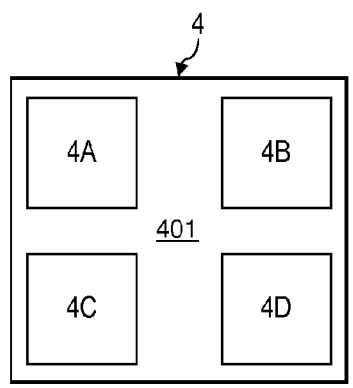
FIG. 16 is a schematic illustration of a view in section of the top of an integrated circuit 4 at the level of the wells.

FIG. 16 schematically illustrates a top view in section of an integrated circuit 4 at the level of the wells, this integrated circuit being made according to the variant illustrated in FIG. 12. In this example, the integrated circuit 4 has a first zone 4A of memory cells, a first zone 4B of logic gates, a second zone 4C of memory cells and a second zone 4D of logic gates.

The substrate 401 is biased to ground. The deep wells of the zone 4A to 4D are biased respectively to Vdds1, Vdds2, Vdds3 and Vdds4.

Figure 17:
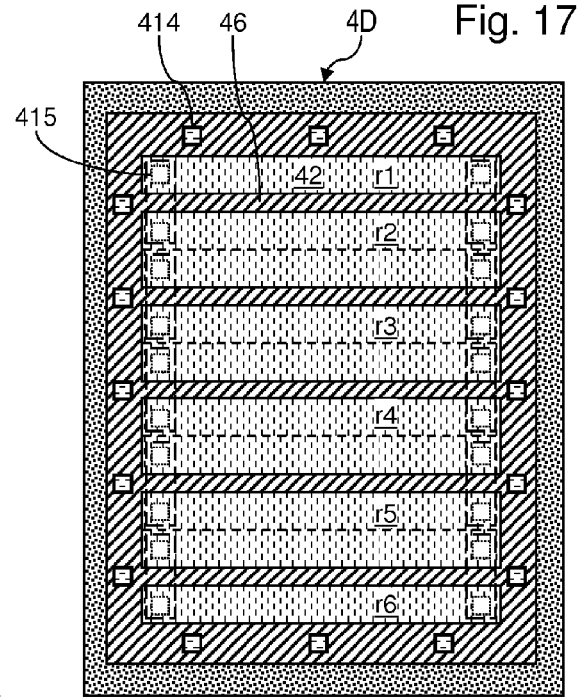
FIG. 17 is a schematic view in section at the wells of a first example of an integration zone.

FIG. 17 is a schematic view in section of the zone 4D at the level of the wells. One can distinguish a P-doped zone 42, forming wells of rows r1 to r6 of transistors. It is possible to distinguish the N-doped junctions 414 intended for biasing a deep well with N-type doping. A zone 46 can be seen forming deep insulation trenches, insulating the junctions 414 from the substrate 401 and insulating the rows of adjacent transistors up to the deep well. Each row contains transistors of the same type insulated by shallow insulation trenches. The adjacent rows form an alternation of nMOS and pMOS transistors. The contact pads 415 for contact with the ground planes, although present at a higher level, are illustrated in dashes in this figure for the sake of clarity.

Figure 18:
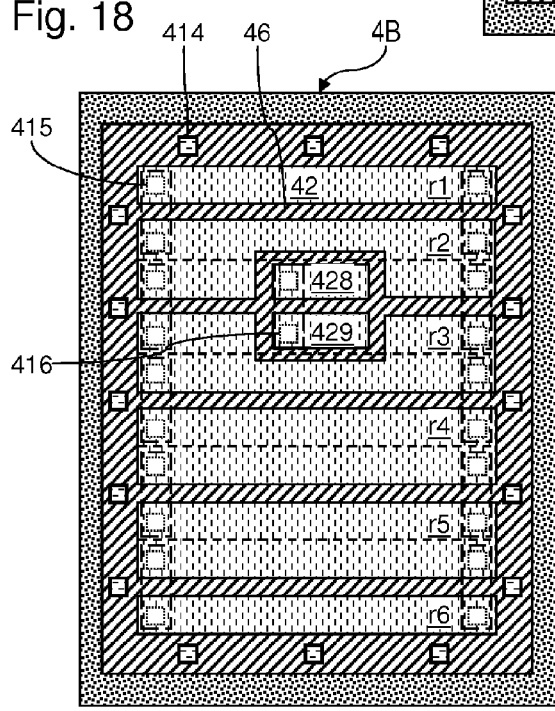
FIG. 18 is a schematic view in section at the wells of a second example of an integration zone.

FIG. 18 is a schematic view in section of the zone 4B at the level of the wells. A P-doped zone 42 forming the wells of rows r1 to r6 of transistors can be seen. It is possible to distinguish N-doped junctions 414 intended for biasing a deep well with N-type doping. It is possible to distinguish a zone 46 forming deep insulation trenches, insulating the junctions 414 from the substrate 401 and insulating the rows of adjacent transistors up to the deep well.

Each row contains transistors of the same type, insulated by shallow insulation trenches. The adjacent rows form an alternation of nMOS and pMOS transistors.

In the adjacent rows r2 and r3, certain transistors are insulated from the rest of the transistors. These transistors comprise especially P-doped wells 428 and 429 separated from the rest of the P-doped zone 42 by means of the deep insulation trench zone 46. These wells 428 and 429 comprise a specific bias distinct from that of the zone 42. The wells 428 and 429 are thus biased by means of contact pads 416. Thus, transistors with specific threshold voltages can be made plumb with the wells 428 and 429.

For the zone 4B of the example of FIG. 18, the method for the automated generation of the topology of etching masks can be the following one. Initially, a logic synthesis model of the integrated circuit 4 is made from a library of standard cells in bulk technology. The adjacent rows of transistors then comprise an alternation of N-type wells and P-type wells. The logic synthesis model is then converted to integrate an ultra-thin buried insulating layer and ground planes.

Shallow insulation wells are placed longitudinally between the transistors of the same row. Deep insulation trenches are then disposed between the rows of N-type wells and the rows of P-type wells. Deep insulation trenches are then disposed around specific zones (defined by wells 428 and 429). The N-type wells are then routinely replaced by P-type wells.

The structures illustrated in FIGS. 12 to 15 are advantageously implemented for SRAM memory cells. These structures indeed provide for a different biasing of the ground planes of the different transistors of the memory cell.

Figure 19:
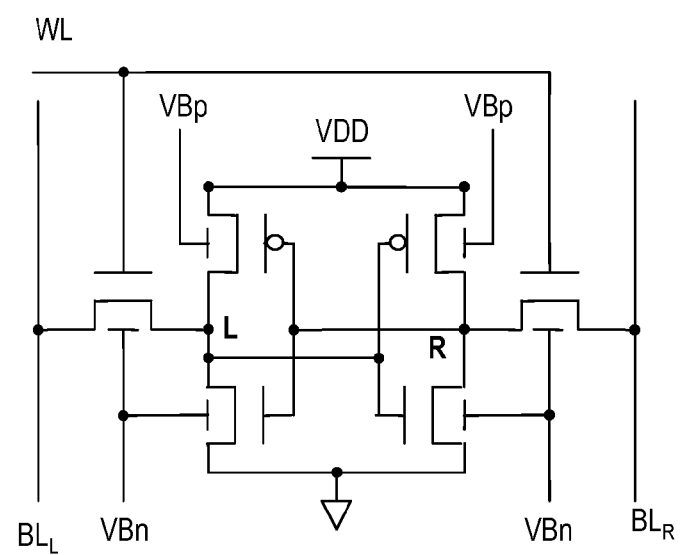
FIG. 19 illustrates the drawing of a 6T type memory cell with bias voltages according to the invention.

For the example of the 6T type SRAM memory cell as illustrated in FIG. 19:

In read mode, it is sought to increase the threshold voltages of the nMOS transistors and lower the threshold voltage of the pMOS transistors. To this end, an RBB type of VBn biasing is done on the ground planes of the nMOS transistors of the cell in passing from a biasing to ground to a biasing to −Vdd. An FBB type biasing VBp is done on the ground planes of the pMOS transistors of the cell in passing from a biasing to Vdd to a biasing to ground.

In read mode, it is sought to increase the threshold voltages of the pMOS transistors and to lower the threshold voltage of the nMOS transistors. To this end, it is possible to carry out an FBB type VBn biasing on the ground planes of the nMOS transistors of the cell, in passing from a biasing to ground to a biasing to +Vdd. An RBB type biasing VBp is done on the ground planes of the pMOS transistors of the cell in passing from a biasing to Vdd to a biasing to 2*Vdd.

Although the invention has been described with gate metal transistors having identical output work factors, the threshold voltages of these transistors can also be modified in forming gates with metals having distinct output work functions.

Although the different layers illustrated in the example (ground planes, wells, deep wells) are illustrated as being sharply dissociated, zones having the same types of doping in distinct layers can of course come from the same step of the fabrication process, inasmuch as the fabrication process makes it possible to obtain layers having distinctive characteristics. The method must make it possible to obtain ground planes having, on a given thickness, a concentration in doping elements that is high enough to enable an effect to be had on the threshold voltage of the transistors disposed so as to be plumb with the structure. Usually, the concentration of the doping in the ground planes is greater than the concentration of the doping in the wells, for example at least five times greater.

In the examples described, the adjacent cells are respectively nMOS and pMOS cells. It is also possible to envisage the application of the invention to adjacent nMOS type cells or to pMOS type adjacent cells.

Having described the invention, and a preferred embodiment thereof, what is claimed as new, and secured by Letters Patent is:

1. A manufacture comprising an integrated circuit, said integrated circuit comprising a stack having a semiconductor substrate with a first type of doping, an UTBOX type buried insulating layer, first and second electronic components, said first and second electronic components being formed in a location selected from said group consisting of in said semiconductor substrate and on said semiconductor substrate, first and second ground planes disposed beneath said buried insulating layer so as to be respectively plumb with said first and second electronic components, first and second wells with said first type of doping, said wells being disposed respectively beneath said first and second ground planes, and a bias circuit enabling distinct voltages to be applied to said first and second ground planes by means of said first and second wells, wherein said first and second wells are separated from said semi-conductor substrate by a deep well with a second type of doping, and wherein said first and second wells are separated from each other by a separating structure selected from said group consisting of a lateral well having a second type of doping and a block of insulating material.

2. The manufacture of claim 1, wherein said first and second wells are separated from each other by a block of insulating material.

3. The manufacture of claim 1, wherein said block of insulating material extends up to said deep well.

4. The manufacture of claim 2, wherein said block of insulating material extends up to said first and second wells but not up to said deep well, and wherein said block overhangs said lateral well presenting said second type of doping and separating said first and second wells.

5. The manufacture of claim 1, wherein said first and second wells are separated from each other by a lateral well, wherein said lateral well has said second type of doping.

6. The manufacture of claim 5, wherein a block of insulating material separates said first and second electronic components at said semiconductor layer, said block of insulating material being formed so as to be plumb with said lateral well, said lateral well extending from said buried insulating layer up to said deep well.

7. The manufacture of claim 5, wherein said first ground plane has said second type of doping and is separated from said lateral band by an additional lateral band having said first type of doping.

8. The manufacture of claim 1, wherein said first electronic component comprises a first FDSOI type transistor, wherein said second electronic component comprises a second FDSOI type transistor, wherein said first and second FDSOI transistors comprise an nMOS type transistor and a pMOS type transistor.

9. The manufacture of claim 8, further comprising a third transistor formed at a location selected from the group consisting of in said first semiconductor layer and on said first semiconductor layer, wherein said third transistor is the same type as said second transistor, a third ground plane disposed beneath said buried insulating layer plumb with said third electronic component, and a third well with said first type of doping disposed beneath said third ground plane in a continuity of said second well.

10. The manufacture of claim 9, wherein said third ground plane is of a type opposite that of said second ground plane.

11. The manufacture of claim 10, wherein a block of insulating material separates said second and third transistors at said semiconductor layer.

12. The manufacture of claim 11, wherein said block of insulating material does not reach said second and third wells.

13. The manufacture of claim 12, wherein said first ground plane has said second type of doping and is separated from said lateral band by an additional lateral band having said first type of doping.

14. The manufacture of claim 11, wherein said block of insulating material reaches said second and third wells but does not reach said deep well.

15. The manufacture of claim 9, wherein said third ground plane is of said same type as said second ground plane.

16. The manufacture of claim 15, wherein a block of insulating material separates said second and third transistors at said semiconductor layer.

17. The manufacture of claim 16, wherein said block of insulating material does not reach said second and third wells.

18. The manufacture of claim 17, wherein said first ground plane has said second type of doping and is separated from said lateral band by an additional lateral band having said first type of doping.

19. The manufacture of claim 17, wherein said first and second electronic components are first and second transistors belonging to an SRAM memory cell.

20. The manufacture of claim 17, wherein said buried insulating layer has a thickness smaller than 50 nm and said thickness of a gate of said transistors is smaller than 50 nm.

* * * * *

UNITED STATES PATENT AND TRADEMARK OFFICE
CERTIFICATE OF CORRECTION

PATENT NO.        : 8,969,967 B2                      Page 1 of 1
APPLICATION NO.   : 14/118955
DATED             : March 3, 2015
INVENTOR(S)       : Jean-Philippe Noel et al.

It is certified that error appears in the above-identified patent and that said Letters Patent is hereby corrected as shown below:

In the Claims,

In Claim 3, please amend to read "The manufacture of claim 2, wherein said block of insulating material extends up to said deep well".

Signed and Sealed this
Eighteenth Day of August, 2015

Michelle K. Lee
*Director of the United States Patent and Trademark Office*